(12) United States Patent
Pubert et al.

(10) Patent No.: US 9,356,597 B2
(45) Date of Patent: May 31, 2016

(54) BIDIRECTIONAL DATA EXCHANGE CIRCUIT

(71) Applicant: THALES, Neuilly sur Seine (FR)

(72) Inventors: Laurent Pubert, Cholet (FR); Jerome Pichet, Cholet (FR); Benjamin Grimonprez, Cholet (FR); Thierry Collange, Cholet (FR)

(73) Assignee: THALES, Neuilly sur Seine (FR)

( * ) Notice: Subject to any disclaimer, the term of this patent is extended or adjusted under 35 U.S.C. 154(b) by 350 days.

(21) Appl. No.: 14/108,405

(22) Filed: Dec. 17, 2013

(65) Prior Publication Data

US 2014/0184269 A1 Jul. 3, 2014

(30) Foreign Application Priority Data

Dec. 17, 2012 (FR) ..................................... 12 03440

(51) Int. Cl.
*H03K 17/00* (2006.01)
*H03K 19/00* (2006.01)
*G06F 13/40* (2006.01)

(52) U.S. Cl.
CPC ........ *H03K 19/0002* (2013.01); *G06F 13/4072* (2013.01)

(58) Field of Classification Search
CPC ................................................. G06F 13/4072
See application file for complete search history.

(56) References Cited

U.S. PATENT DOCUMENTS

| 5,418,933 | A | 5/1995 | Kimura et al. |
| 5,877,633 | A | 3/1999 | Ng et al. |
| 6,169,443 | B1 * | 1/2001 | Shigehara ............ H03K 17/063 327/404 |
| 7,205,793 | B2 * | 4/2007 | George ............ H03K 19/01759 326/56 |

FOREIGN PATENT DOCUMENTS

| EP | 0044397 A1 | 1/1982 |
| JP | 1992-199351 | 7/1992 |

\* cited by examiner

*Primary Examiner* — Hai L Nguyen
(74) *Attorney, Agent, or Firm* — Polsinelli PC

(57) ABSTRACT

A bidirectional data exchange circuit (10) includes a buffer (16) having paired terminals (A1 ... A8, B1 ... B8), a transfer direction input (20), an input (42) for controlling the transfer direction, and a logic gate (50). In the logic gate (50), the output is connected to the transfer direction input (20), an input is connected to the input (42) for controlling the transfer direction, this input being further connected to a first reference potential ($V_{cc}$) through a resistor (52), and the other input is connected to a terminal (A1) of the buffer (16) and to the first reference potential ($V_{cc}$) through a resistor (54; 154), and the terminal (B1) of the buffer (16), matched with the terminal (A1) of the buffer to which is connected the other input of the logic gate (50) being connected to a second reference potential through a resistor (56). The order of the first and second reference potentials and the nature of the logic gate (50) are such that, after a first transfer direction control of the buffer in one direction, the matched terminals (A1) force the logic gate (50) into a predetermined state independent of the value of the signal on the direction control input (42).

5 Claims, 3 Drawing Sheets

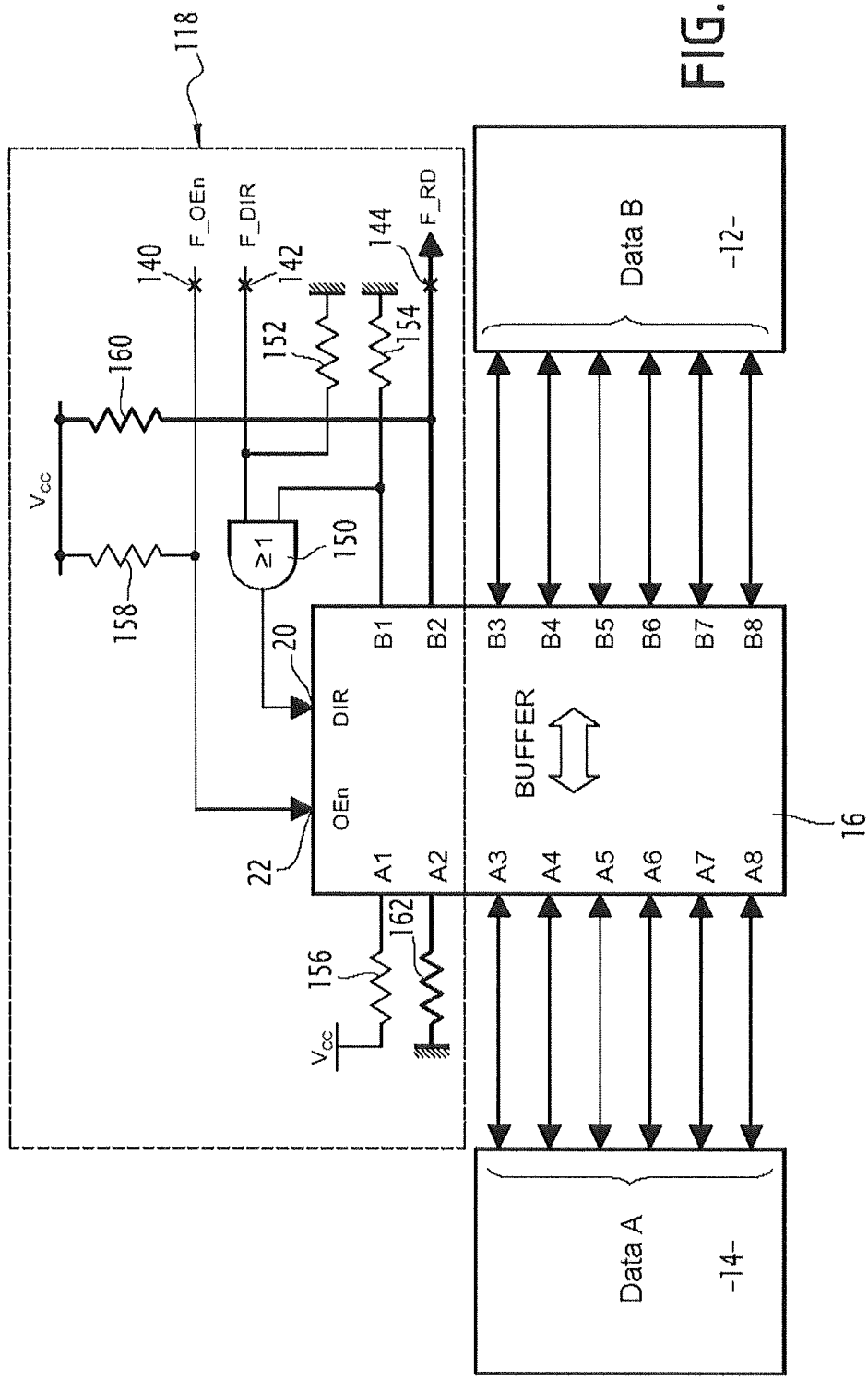

BIDIRECTIONAL DATA EXCHANGE CIRCUIT

CROSS-REFERENCE TO RELATED APPLICATIONS

This application claims benefit (under 35 USC 119(e)) of French Application Serial No. 12-03440, filed Dec. 17, 2012, which is incorporated herein by reference in its entirety.

TECHNICAL FIELD AND STATE OF THE ART

The present invention relates to a bidirectional data exchange circuit including:
a buffer including:
  a first set of terminals and a second set of terminals, for which the terminals are paired two by two for bidirectional data exchange between two paired terminals of the two sets;
  an input in the direction of transfer between two paired terminals from one input to one output, the input being placed at a high impedance in the absence of any voltage on these terminals;
  an input for controlling the transfer direction.

In certain digital electronic boards having safety PLCs, for example in railway signaling circuits, it is necessary to allow initial writing of data through a buffer or buffer memory, and then subsequently prevent any new writing, while allowing, through the buffer, read-only access to data contained in the memory.

The buffer is then integrated into an exchange circuit allowing a programmable circuit to initially write-access a memory so as to write data therein and then definitively lock these data so as to only allow them to be read out from the memory after this first writing phase.

A bidirectional buffer includes a control terminal capable of receiving a direction signal giving the possibility of forcing in the buffer, flow of the data in only one of the two possible directions.

In order to allow locking of a bidirectional buffer, it is for example known how to control the direction signal by means of a jumper on the electronic board. This solution however requires a tedious manual operation.

Controlling the direction signal with a programmable component is also known. However this solution has bug risks, which is harmful to functional safety. Indeed, the control of the direction signal for the buffer directly by a programmable component may be compromised by faulty software.

Another solution consists of controlling the direction signal by means of a flip-flop, benefiting from the memory effect of this type of component, making the control of the signal independent of a possible fault in the software of the programmable component.

The use of specific logic components such as a flip-flop requires nomenclature management of a new type of components little used or not at all, which increases the cost of the electronic board.

SUMMARY OF THE INVENTION

The object of the invention is to propose a bidirectional data exchange circuit, for which the data transfer direction may be definitively set after a first selection in the data flow direction, which is secure and guarantees transferred data security.

For this purpose, the object of the invention is a bidirectional data exchange circuit of the aforementioned type, characterized in that it includes a logic gate for which:
  the output is connected to the transfer direction input of the buffer;
  an input is connected to the transfer direction control input, this input being further connected to a first reference potential through a resistor; and
  the other input is connected to a terminal of the buffer and to the first reference potential through a resistor;
  the terminal of the buffer mating the terminal of the buffer to which the other input of the logic gate is connected, being connected to a second reference potential through a resistor;
and in that the order of the first and second reference voltages and the nature of the logic gate are such that, after a first transfer direction control of the buffer in one direction, the matched terminals will force the logic gate into a predetermined state independent of the value of the signal on the direction control input.

According to particular embodiments, the bidirectional data exchange circuit includes one or several of the following features according to all the technically possible combinations:
  the logic gate is an AND gate, and the second reference potential is less than the first reference potential;
  the logic gate is an OR gate and the second reference potential is greater than the first reference potential;
  the buffer includes an input for an activation signal, preventing any transfer between two matched terminals in the absence of an activation signal; and
  the buffer includes two matched auxiliary terminals different from the matched terminals in connection with the direction control input, for which:
    the auxiliary terminal of the same set as the terminal connected to the logic gate, is connected:
    two an output for providing information representative of the transfer direction on the one hand and,
    through a resistor to one of the first and second reference potentials on the other hand, and
  the other auxiliary terminal is connected through a resistor to the other one of the first and second reference potentials.

DESCRIPTION OF THE DRAWINGS

The invention will be better understood upon reading the description which follows, only given as example and made with reference to the drawings wherein:

FIG. 3 is a view identical with the one of FIG. 1 of a second embodiment of a bidirectional data exchange circuit blocking, after an initial authorization, the flow of data in a second direction opposite to the first direction.

DETAILED DESCRIPTION OF EMBODIMENTS

Figure 1:
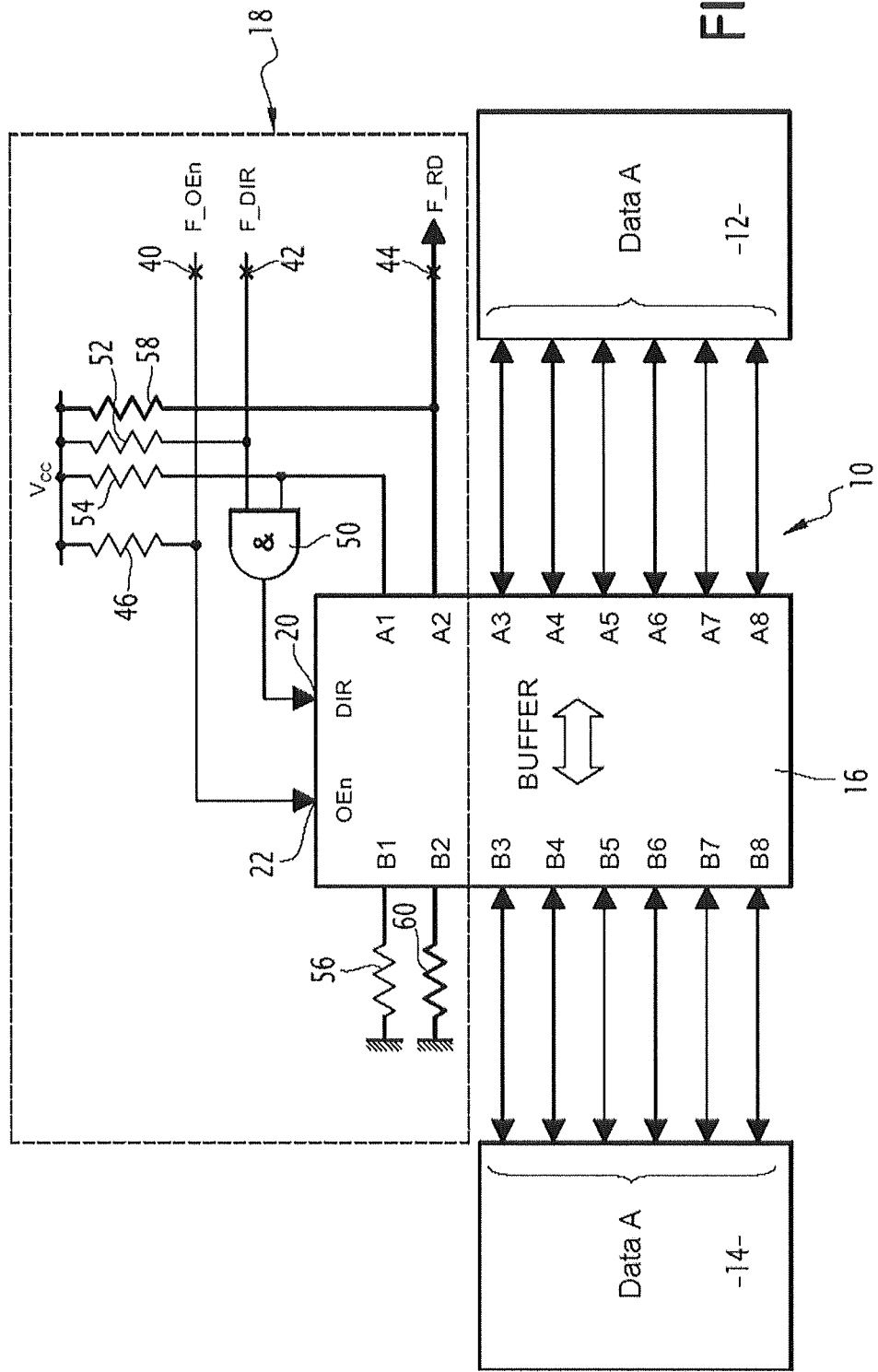
FIG. 1 is a schematic view of a first embodiment of a bidirectional data exchange circuit according to the invention blocking, after an initial authorization, the transfer of data in a first direction.

The bidirectional data exchange circuit 10 illustrated in FIG. 1 is for example applied between a processor 12 and a memory 14, and more generally between two electronic devices having to exchange data.

The exchange circuit 10 is able to allow, during a single initial phase, the transfer of data from the processor 12 towards the memory 14 and then after this initial transfer to only allow in future transfer of the data from the memory 14 note to the processor 12, without the processor being able to again write into the memory.

The circuit 10 includes a buffer or buffer memory 16. It further includes a circuit 18 for controlling the transfer direction of the data in the buffer 16.

This control module 18 only includes discrete passive elements, such as AND or OR logic gates and resistors.

The buffer 16 includes, as this is known per se, two sets of two-by-two matched terminals per route allowing transfer of data from one terminal of a set to another matched terminal of the other set according to the selected transfer direction. In the following, the terminal receiving the data is designated as an input and the terminal through which the data of the buffer are outputted is designated as an output.

The buffer for example includes eight routes, the terminals of a set being noted from A1 to A8 and the terminals of the other set being respectively designated as B1 to B8 for the matched terminals of a same route.

In the relevant example, the terminals A3 to A8 are connected to corresponding terminals of the processor 12 and the terminals B3 to B8 are connected to corresponding terminals of the memory 14. The terminals A1, A2, B1 and B2 are reserved for the control module 18, to which they are connected.

As known per se, the buffer 16 includes a transfer direction input 20, for which the applied direction signal is noted as DIR and an actuation input 22 for which the applied actuation signal is noted as OEn.

Figure 2:
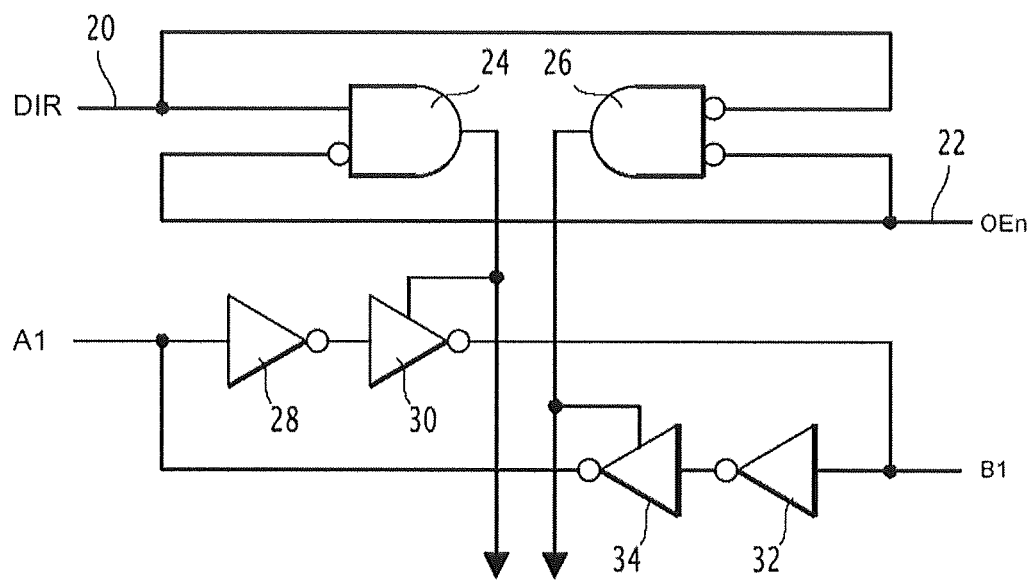
FIG. 2 is a schematic view of the structure of the buffer used in the exchange circuit of FIG. 1.

In FIG. 2 the internal structure of the buffer 16 is illustrated. In this figure, only the matched terminals A1 and B1 are illustrated, the other matched terminals A2-B2 to A8-B8 being connected through a layout with the same structure, not shown.

In this figure, are again found the direction input 20 and the actuation input 22.

The buffer 16 includes two AND gates 24, 26, the outputs of which are able to ensure the control of the transfer direction from the terminal A1 to the terminal B1 for the gate 24 and from the terminal B1 to the terminal A1 pour the gate 26.

The terminal A1 is connected to the input of an inverter 28, the output of which is connected to the input of a buffer with three states, a so-called tri-state buffer 30 with an inverter output, the output of which is connected to the matched terminal B1.

The control terminal of the tri-state buffer 30 is connected to the output of the AND gate 24. Also the terminal B1 is connected to the terminal A1 with successively in this order, an inverter 32 and a tri-state buffer 34, the control terminal of which is connected to the output of the AND gate 26.

The same applies for all the matched terminals A2 to A8 with the terminals B2 to B8.

The direction input 20 is connected to one of the inputs of the AND gate 24 and to an inverting input of the AND gate 26. Also, the activation input 22 is connected to the inputs of both gates 24, 26 through two inverting inputs.

Thus for each pair of matched terminals, the buffer 16 is governed by the following truth table:

TRUTH TABLE 1

| Control inputs | | Terminals | | |
|---|---|---|---|---|
| OEn | DIR | A | B | OPERATION |
| L | L | Enabled | Hi-Z | B to A |
| L | H | Hi-Z | Enabled | A to B |
| H | X | Hi-Z | Hi-Z | Isolation | wherein:
H = high or 1 state
L = low or 0 state
X = any state
Enabled = active output
Hi-Z = high impedance state The transfer circuit 18 includes an actuation input 40, and input for controlling the transfer direction 42 and an output 44 for reading the transfer direction.

The input 40 is connected to the actuation input 22, as well as to a high reference potential, noted as $V_{cc}$, through a resistor 46.

The direction control input 42 is connected to a first input of an AND gate 50, itself connected to the high reference potential $V_{cc}$ through a resistor 52. The other input of the gate 50 is connected to the high reference potential $V_{cc}$ through a resistor 54 as well as to the terminal A1 of the buffer 16. The output of the gate 50 is connected to the direction input 20 of the buffer 16.

The terminal B1 matched with the terminal A1 of the buffer is connected to ground through a resistor 56.

The terminal A2 is directly connected to the transfer direction readout output 44. This output is also connected to the high reference potential $V_{cc}$ through a resistor 58.

The terminal B2 matched with the terminal A1 is, for its own part, connected to ground through a resistor 60.

The operation of the bidirectional data exchange circuit 10 will now be described with reference to FIG. 1 and with reference to the following truth table 2:

| | | | | | Truth table 2 | |
|---|---|---|---|---|---|---|
| OEn | DIR | F_DIR | A1 | B1 | Operation | Comment |
| 1 | X | X | $Z_1$ | $Z_0$ | isolation | The function F inhibits the A and B data ports |
| 1 | 1 | 1 | $Z_1$ | $Z_0$ | isolation | The IOs of the function F are in Z during its initialization |
| 0 | 1 | 1 | $Z_1$ | 1 | A → B | The function F receives F_RD = 1 (write position) |
| 0 | 0 | 0 | 0 | $Z_0$ | A ← B | The function F receives F_RD = 0 (read position) |
| 0 | 0 | X | 0 | $Z_0$ | A ← B | The buffer is definitively positioned for reading |

In this table, the values of the signals OEn and DIR respectively appear at the control 22 and direction 20 inputs of the buffer, as well as the value of the direction control signal $F_{DIR}$ applied at the input 42. The signals or impedances observed on the terminals A1 and B1 of the buffer are also apparent. The following codes are used:
0/1: logic states 0/1
$Z_0$: Hi-Z state (signal with pull-down)

$Z_1$: Hi-Z state (signal with pull-up)
X: any state
IO: input/output

Initially, on power on, the signal OEn is in state 1, thereby guaranteeing that the tri-state buffers 30, 34 provide the terminals A1 and B1 with high impedance states, noted as $Z_1$ and $Z_0$ respectively, regardless of the values of the signals DIR and $F_{DIR}$.

The transfer direction signal $F_{DIR}$ switching to 1, the direction signal DIR also switches to 1, the AND gate 50 seeing a signal 1 at each of its inputs.

In the relevant example, when DIR is equal to 1, data transfer is carried out from the terminals A to the terminals B.

On the contrary, when DIR is equal to 0, transfer is carried out from the terminals B to the terminals A.

As long as the signal OEn is not equal to 0, the terminals A and B are isolated. As soon as the signal OEn switches to 0, data transfer from the terminals A to B is possible. During this phase, the data from the processor 12 are transmitted to the memory 14 in which they are stored.

Simultaneously, the terminal B1 switches to state 1, since the terminal A1 is at a high impedance and produces a high logic state equal to 1 because of its connection to the reference potential $V_{cc}$ through the resistor 54.

Also the terminal A2 switches to state 1, the terminal A2 being at high impedance and connected to the reference potential $V_{cc}$ through the resistor 58.

The output 44 then provides a signal F_RD equal to 1 which is a piece of information which may be used and is representative of the actual transfer direction of the buffer.

Once the whole of the data transfers have been achieved from the terminals A to the terminals B, the signal $F_{DIR}$ switches to 0 under the control of a suitable central information processing unit, causing the signal with the direction DIR to pass to 0. The communication direction is then inverted, the terminals A copying the values of terminals B.

As the terminal B1 is connected to ground through the resistor 56, the latter is at a high impedance, which may be assimilated to a low logic state, leading to the generation of a low logic state on the terminal A1. This low logic state on the terminal A1 leads to one of the inputs of the AND gate 50 being equal to 0. Thus, regardless of the value of the signal $F_{DIR}$, the direction input 20 receives a low logic state produced by the AND gate 50, definitively positioning the data flow direction from the terminals B to the terminals A.

Also, as the terminal B2 is connected to ground through the resistor 60, the latter is at a high impedance which may be assimilated to a low logic state. The terminal A2 therefore provides the signal F_RD equal to 0.

The signal F_RD then again provides a piece of information, representative of the data transfer direction in the buffer.

The use in the buffer of a separate route from the A1-B1 route for providing the piece of information F_RD avoids that the signal applied onto the terminal A1 be read for providing the signal F_RD. Indeed, in the case of malfunction of the readout means connected on the terminal A1, the signal on this terminal might be forced to a high state and therefore reposition the buffer in the A-to-B transfer direction, which should be avoided.

It is conceivable that with such a circuit, blocking of the transfer of data from the memory 14 to the processor 12 is reliably ensured, after an initial transfer possibility from the processor 12 to the memory 14.

In FIG. 3, an alternative embodiment of the circuit is illustrated, applying the same buffer 16 and allowing blocking of the transfers from A to B after a possible initial transfer phase. In this case, the processor 12 is connected to the terminals B while the memory 14 is connected to the terminals A.

Only the differences relatively to the previous embodiment are described here. They deal with the control module noted as 118.

As previously, the control module 118 includes an activation input 140, a direction control input 142 and an output 144 for reading out the transfer direction.

The direction control input 142 is connected to a first input of a OR logic gate 150, the output of which is connected to the control input 20 of the buffer 16. The input 142 is further connected to the ground through a resistor 152.

The other input of the OR gate 150 is connected to the terminal B1 of the buffer 16 on the one hand and to the ground through a resistor 154 on the other hand.

The terminal A1 matched with the terminal B1 of the buffer is connected to the reference voltage $V_{cc}$ through a resistor 156. The actuation input 140 is connected to the input 22 as well as to the reference voltage $V_{cc}$ through a resistor 158.

Finally, the output 144 for reading out the transfer direction is connected to the terminal B2 as well as to the reference potential $V_{cc}$ through a resistor 160, the terminal A2 matched with the terminal B1 being connected to the ground through a resistor 162.

The operation of this second embodiment of FIG. 3 is subsequently described with reference to the truth table 3.

Truth table 3

| OEn | DIR | F_DIR | B1 | A1 | Operation | Comment |
|---|---|---|---|---|---|---|
| 1 | X | X | $Z_0$ | $Z_1$ | isolation | The function F inhibits the data ports A and B |
| 1 | 0 | 0 | $Z_0$ | $Z_1$ | isolation | The IOs of function F are in Z during its initialization |
| 0 | 0 | 0 | $Z_0$ | 0 | B → A | The function F receives F_RD = 1 (write position) |
| 0 | 1 | 1 | 1 | $Z_1$ | B ← A | The function F receives F_RD = 0 (read position) |
| 0 | 1 | X | 1 | $Z_1$ | B ← A | The buffer is definitively positioned for reading |

These notations are the same as in Table 2.

As previously, upon power-up, the signal OEn is in the 1 state so that the terminals B1 and A1 provide high impedance states $Z_0$ and $Z_1$ respectively. When the transfer direction signal $F_{DIR}$ switches to 0, the direction signal DIR also switches to 0, since the terminal B1 connected to ground through the resistor 154 produces a low logic state.

The transfer is therefore carried out in the buffer 16 from the terminals B to the terminals A potentially.

When the signal OEn switches to 0, transfer of data from the terminals B to A is possible. The data of the processor 12 are then transmitted to the memory 14.

Terminal A1 switches to the 0 state, since the terminal B1 which it copies is at a high impedance and produces a low logic state equal to 0 because of the connection to ground through the resistor 154.

The terminal B2 is in the 1 state, because of his connection to the reference potential $V_{cc}$ through the resistor 160. The output 144 then provides a signal F_RD equal to 1 characterized in a transfer direction from the processor 12 to the memory 14.

After achieving the transfers, the signal $F_{DIR}$ switches to 1 under the control of a central information processing unit so that the direction signal DIR also switches to 1. Data transfer is then only possible from the memory 14 to the processor 12.

The terminal A1 being connected to the reference voltage $V_{cc}$ through the resistor 156, it is permanently maintained in a high impedance state equal to $Z_1$ since A1 is no longer an output but a high impedance input. This guarantees that the input of the OR gate 150 connected to the terminal B1 permanently receives a high logic state.

Thus, in this way, regardless of the value of the signal $F_{DIR}$, the direction input 20 receives a high logic state, thereby blocking transfer of data from the memory 14 to the processor 12.

This layout provides the same advantages as the one described in connection with FIG. 1.

The invention was described in conjunction with one or more special embodiments. It goes without saying, however, that changes and modifications can be undertaken without departing from the protective scope of the claims below.

The invention claimed is:

1. A bidirectional data exchange circuit (10) comprising:
   a buffer (16) including:
     a first set of terminals (A1 ... A8) and a second set of terminals (B1 ... B8) the terminals of which are matched pairwise for a bidirectional data exchange between two matched terminals of both sets;
     a transfer direction input (20) between two matched terminals from an input to an output, the input being placed at a high impedance state in the absence of voltage on these terminals;
   an input (42; 142) for controlling the transfer direction; and
   a logic gate (50; 150) for which:
     the output is connected to the transfer direction input (20) of the buffer (16);
     an input is connected to the input for controlling the transfer direction (42; 142), this input being further connected to a first reference potential ($V_{cc}$; 0) through a resistor (52; 152); and
     the other input is connected to a terminal (A1; B1) of the buffer (16) and to the first reference potential ($V_{cc}$; 0) through a resistor (54; 154);
   the terminal (B1; A1) of the buffer (16) matched with the terminal (A1; B1) of the buffer to which is connected the other input of the logic gate (50; 150) being connected to a second reference potential (0; $V_{cc}$) through a resistor (56; 156);
   and in that the order of the first and second reference potentials and the nature of the logic gate (50; 150) are such that, after a first transfer direction control of the buffer in one direction, the matched terminals (A1; B1) force the logic gate (50; 150) into a predetermined state independent of the value of the signal on the direction control input (42; 142).

2. The exchange circuit (10) according to claim 1, wherein the logic gates is an AND gate (50), and the second reference potential is lower than the first reference potential.

3. The exchange circuit (10) according to claim 1, wherein the logic gate is an OR gate (150) and the second reference potential is higher than the first reference potential.

4. The logic circuit according to claim 1, wherein the buffer (16) includes an input (22) for an activation signal, preventing any transfer between two matched terminals in the absence of an activation signal.

5. The logic circuit according to claim 1, wherein the buffer (16) includes two matched auxiliary terminals (A2, B2) different from the matched terminals (A1, B1) in connection with the direction control input (20), for which:
   the auxiliary terminal (A2; B2) of the same set as the terminal (A1; B1) connected to the logic gate (50; 150) is connected:
     to an output (44; 144) for providing a piece of information representative of the transfer direction on the one hand and,
     through a resistor (58; 160), to one of the first and second reference potentials ($V_{cc}$; 0) on the other hand, and
   the other auxiliary terminal (B2; A2) is connected through a resistor (60; 162) to the other one of the first and second reference potentials ($V_{cc}$; 0).

* * * * *